(12) United States Patent
Mignot et al.

(10) Patent No.: US 11,101,175 B2
(45) Date of Patent: Aug. 24, 2021

(54) TALL TRENCHES FOR VIA CHAMFERLESS AND SELF FORMING BARRIER

(71) Applicant: International Business Machines Corporation, Armonk, NY (US)

(72) Inventors: Yann Mignot, Slingerlands, NY (US); Chih-Chao Yang, Glenmont, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/197,558

(22) Filed: Nov. 21, 2018

(65) Prior Publication Data
US 2020/0161180 A1    May 21, 2020

(51) Int. Cl.
*H01L 23/528* (2006.01)
*H01L 21/768* (2006.01)
(Continued)

(52) U.S. Cl.
CPC .. *H01L 21/76897* (2013.01); *H01L 21/31111* (2013.01); *H01L 21/76829* (2013.01);
(Continued)

(58) Field of Classification Search
CPC ............... H01L 23/528; H01L 23/5226; H01L 2027/11875; H01L 29/0649; H01L 21/823475; H01L 23/53295; H01L 21/76813; H01L 21/76877–76883; H01L 21/76802–76817; H01L 2221/1015–1036; H01L 21/76807–76813; H01L 2224/3003; H01L 2224/3005; H01L 23/5221; H01L 23/535; H01L 1123/535
See application file for complete search history.

(56) References Cited

U.S. PATENT DOCUMENTS

| 5,512,512 A | 4/1996 | Lee |
| 5,512,514 A | 4/1996 | Lee |

(Continued)

OTHER PUBLICATIONS

Briggs et al., "Structure and Method for Fully Aligned Vias Utilizing Selective Metal Deposition" Aug. 11, 2016.
(Continued)

*Primary Examiner* — Jarrett J Stark
(74) *Attorney, Agent, or Firm* — Fleit Intellectual Property Law; Thomas S. Grzesik

(57) ABSTRACT

Chamferless via structures and methods of manufacture are provided. The structures include a conductive line and a set of chamferless wiring vias formed in a dielectric material with at least one of the vias in contact with the conductive line. The set of chamferless wiring vias is formed with at least a first subset of wiring vias of a first height and a second subset of wiring vias of a second height. The method includes filling trenches within a substrate with a conductive material to form a set of wiring vias with a first height. Next, a block mask is used over a capping material layer to expose a portion of the conductive material layer. The capping material and the conductive material of the set of wiring vias defined by the block mask are etched forming a subset of wiring vias of the second height.

17 Claims, 8 Drawing Sheets

(51) Int. Cl.
  *H01L 23/532* (2006.01)
  *H01L 21/311* (2006.01)
(52) U.S. Cl.
  CPC ...... *H01L 21/76877* (2013.01); *H01L 23/528* (2013.01); *H01L 23/53209* (2013.01)

(56) References Cited

U.S. PATENT DOCUMENTS

| | | | |
|---|---|---|---|
| 5,691,238 A | 11/1997 | Avanzino et al. | |
| 5,693,568 A | 12/1997 | Liu et al. | |
| 5,773,365 A | 6/1998 | Ito | |
| 5,798,559 A * | 8/1998 | Bothra | H01L 21/7682 257/508 |
| 5,960,254 A | 9/1999 | Cronin | |
| 5,970,376 A | 10/1999 | Chen | |
| 6,143,640 A | 11/2000 | Cronin et al. | |
| 6,352,917 B1 | 3/2002 | Gupta et al. | |
| 6,426,558 B1 * | 7/2002 | Chapple-Sokol | H01L 23/5226 257/758 |
| 6,495,917 B1 * | 12/2002 | Ellis-Monaghan | H01L 21/76801 257/752 |
| 6,566,242 B1 * | 5/2003 | Adams | H01L 21/31053 257/E21.244 |
| 6,633,074 B2 * | 10/2003 | Ahn | H01L 21/7682 257/522 |
| 6,815,329 B2 * | 11/2004 | Babich | H01L 21/7681 257/E21.579 |
| 7,064,439 B1 * | 6/2006 | Berthold | H01L 21/76843 257/758 |
| 7,067,902 B2 | 6/2006 | Hichri et al. | |
| 7,196,423 B2 | 3/2007 | Wu et al. | |
| 7,608,538 B2 * | 10/2009 | Deligianni | H01L 21/76879 204/194 |
| 8,008,788 B2 * | 8/2011 | Koketsu | H01L 24/13 257/797 |
| 8,114,769 B1 * | 2/2012 | Srivastava | H01L 21/31144 257/E21.579 |
| 8,299,625 B2 | 10/2012 | Ponoth et al. | |
| 8,461,046 B2 * | 6/2013 | Vannier | H01L 21/76843 257/E21.585 |
| 8,633,520 B2 * | 1/2014 | Yu | H01L 21/76895 257/211 |
| 8,835,305 B2 * | 9/2014 | Yang | H01L 23/528 257/700 |
| 8,921,150 B2 | 12/2014 | Lu et al. | |
| 9,123,790 B2 * | 9/2015 | Pillarisetty | H01L 29/66477 |
| 9,171,801 B2 * | 10/2015 | Bao | H01L 23/5256 |
| 9,236,292 B2 | 1/2016 | Romero et al. | |
| 9,379,027 B2 * | 6/2016 | Kim | H01L 27/11807 |
| 9,401,323 B1 | 7/2016 | Farooq et al. | |
| 9,490,168 B1 | 11/2016 | Chen et al. | |
| 9,536,830 B2 * | 1/2017 | Bao | H01L 23/528 |
| 9,548,243 B1 | 1/2017 | Briggs et al. | |
| 9,576,894 B2 * | 2/2017 | Singh | H01L 21/31144 |
| 9,607,893 B1 * | 3/2017 | Zhang | H01L 21/0337 |
| 9,613,862 B2 * | 4/2017 | Lenhardt | H01L 21/76811 |
| 9,653,399 B2 * | 5/2017 | Zhu | H01L 21/823828 |
| 9,673,095 B2 | 6/2017 | Farooq et al. | |
| 9,685,366 B1 * | 6/2017 | Briggs | H01L 21/76828 |
| 9,793,246 B1 * | 10/2017 | Tseng | H01L 24/20 |
| 9,806,027 B2 * | 10/2017 | Kim | H01L 23/535 |
| 9,917,137 B1 | 3/2018 | Briggs et al. | |
| 10,177,156 B2 * | 1/2019 | He | H01L 23/535 |
| 10,269,699 B2 * | 4/2019 | Ma | H01L 27/0629 |
| 10,290,632 B2 * | 5/2019 | Scott | H01L 23/535 |
| 10,325,807 B2 * | 6/2019 | Samra | H01L 21/76897 |
| 10,347,528 B1 * | 7/2019 | Singh | H01L 23/53266 |
| 10,763,304 B2 * | 9/2020 | Hsu | H01L 43/02 |
| 2004/0124457 A1 | 7/2004 | Kubo | H01L 27/10897 257/296 |
| 2004/0192037 A1 * | 9/2004 | Barns | H01L 21/76879 438/687 |
| 2005/0067633 A1 * | 3/2005 | Mushika | H01L 21/823871 257/202 |
| 2005/0239273 A1 * | 10/2005 | Yang | H01L 23/5258 438/601 |
| 2006/0097397 A1 * | 5/2006 | Russell | H01L 21/76847 257/762 |
| 2006/0197228 A1 * | 9/2006 | Daubenspeck | H01L 21/31144 257/773 |
| 2007/0164434 A1 * | 7/2007 | Watanabe | H01L 28/75 257/758 |
| 2008/0026563 A1 * | 1/2008 | Kanamura | H01L 21/76835 438/623 |
| 2008/0073748 A1 * | 3/2008 | Bielefeld | H01L 23/5222 257/522 |
| 2008/0136029 A1 * | 6/2008 | Liu | H01L 21/76849 257/751 |
| 2008/0237789 A1 | 10/2008 | He et al. | |
| 2009/0045388 A1 * | 2/2009 | Clevenger | H01L 45/1206 257/4 |
| 2009/0057905 A1 * | 3/2009 | Keum | H01L 23/528 257/751 |
| 2009/0068836 A1 * | 3/2009 | Kim | H01L 21/76816 438/656 |
| 2010/0052018 A1 | 3/2010 | Cohen et al. | |
| 2010/0081275 A1 * | 4/2010 | Ishizaka | H01L 21/76883 438/653 |
| 2010/0130001 A1 * | 5/2010 | Noguchi | H01L 21/02697 438/627 |
| 2010/0181673 A1 * | 7/2010 | Hayashi | H01L 21/76877 257/754 |
| 2010/0197135 A1 * | 8/2010 | Ishizaka | H01L 21/28556 438/653 |
| 2010/0264538 A1 | 10/2010 | Swinnen et al. | |
| 2011/0121375 A1 * | 5/2011 | Kawahara | H01L 23/53238 257/296 |
| 2011/0189438 A1 * | 8/2011 | Furusho | C23C 14/04 428/156 |
| 2011/0223734 A1 * | 9/2011 | Davis | H01L 21/3086 438/296 |
| 2011/0223759 A1 * | 9/2011 | Wang | H01L 21/76829 438/618 |
| 2012/0104622 A1 * | 5/2012 | Kim | H01L 21/76808 257/774 |
| 2012/0168957 A1 * | 7/2012 | Srivastava | H01L 21/31144 257/774 |
| 2012/0248609 A1 * | 10/2012 | Tomita | H01L 21/76804 257/751 |
| 2013/0026606 A1 | 1/2013 | Farooq et al. | |
| 2013/0127055 A1 * | 5/2013 | Chen | H01L 21/76847 257/751 |
| 2013/0187273 A1 * | 7/2013 | Zhang | H01L 21/76885 257/751 |
| 2013/0207270 A1 | 8/2013 | Holmes et al. | |
| 2013/0244422 A1 * | 9/2013 | Zhang | H01L 21/76879 438/653 |
| 2013/0328208 A1 | 12/2013 | Holmes et al. | |
| 2014/0027822 A1 * | 1/2014 | Su | H01L 21/76843 257/288 |
| 2014/0232013 A1 * | 8/2014 | Wu | H01L 21/76898 257/775 |
| 2014/0239363 A1 * | 8/2014 | Pan | H01L 27/04 257/306 |
| 2014/0239503 A1 * | 8/2014 | Huisinga | H01L 23/485 257/773 |
| 2014/0252538 A1 * | 9/2014 | Bao | H01L 23/345 257/529 |
| 2014/0252618 A1 * | 9/2014 | Peng | H01L 23/5226 257/751 |
| 2015/0076695 A1 * | 3/2015 | Cheng | H01L 23/5226 257/751 |
| 2015/0145055 A1 * | 5/2015 | Kim | H01L 21/768 257/368 |
| 2015/0171010 A1 | 6/2015 | Bristol et al. | |
| 2015/0214101 A1 * | 7/2015 | Ren | H01L 21/31138 438/704 |

(56) References Cited

U.S. PATENT DOCUMENTS

| | | | |
|---|---|---|---|
| 2015/0262873 A1* | 9/2015 | Chu | H01L 21/76805 257/773 |
| 2015/0279733 A1* | 10/2015 | Ferrer | H01L 21/7684 257/734 |
| 2015/0311113 A1* | 10/2015 | Zhang | H01L 21/76816 257/773 |
| 2015/0340326 A1* | 11/2015 | Lytle | H01L 21/823842 257/372 |
| 2015/0371907 A1* | 12/2015 | Lu | H01L 22/14 257/48 |
| 2015/0380296 A1* | 12/2015 | Antonelli | C23C 16/16 438/643 |
| 2016/0125833 A1* | 5/2016 | Kim | H01L 23/5226 345/212 |
| 2016/0163587 A1 | 6/2016 | Backes et al. | |
| 2016/0190006 A1* | 6/2016 | Chen | H01L 21/76811 438/666 |
| 2017/0062275 A1* | 3/2017 | Lenhardt | H01L 21/31144 |
| 2017/0092536 A1* | 3/2017 | Yang | H01L 21/76844 |
| 2017/0178949 A1* | 6/2017 | Nguyen | H01L 21/76834 |
| 2017/0213786 A1* | 7/2017 | Ahn | H01L 23/5329 |
| 2017/0213790 A1* | 7/2017 | Wang | H01L 21/76877 |
| 2017/0213792 A1* | 7/2017 | Nag | H01L 21/76805 |
| 2017/0229395 A1* | 8/2017 | Kim | H01L 28/00 |
| 2017/0256449 A1* | 9/2017 | Zhang | H01L 21/76882 |
| 2017/0278786 A1* | 9/2017 | Inoue | H01L 23/53295 |
| 2017/0301624 A1* | 10/2017 | Briggs | H01L 21/32134 |
| 2018/0033685 A1* | 2/2018 | Chen | H01L 21/31144 |
| 2018/0040510 A1* | 2/2018 | Briggs | H01L 23/5283 |
| 2018/0040813 A1* | 2/2018 | Han | H01L 43/08 |
| 2018/0061700 A1 | 3/2018 | Sun et al. | |
| 2018/0102257 A1* | 4/2018 | Nagabhirava | H01L 21/31144 |
| 2018/0350665 A1* | 12/2018 | Chae | H01L 23/5283 |
| 2019/0067089 A1* | 2/2019 | Yang | H01L 21/76811 |
| 2019/0363008 A1* | 11/2019 | Gstrein | H01L 21/76849 |
| 2020/0006126 A1* | 1/2020 | Liou | H01L 21/76826 |
| 2020/0020634 A1* | 1/2020 | Tsai | H01L 24/19 |
| 2020/0091241 A1* | 3/2020 | Sumino | H01L 27/105 |
| 2020/0259083 A1* | 8/2020 | He | H01L 45/1641 |
| 2020/0365506 A1* | 11/2020 | Gardner | H01L 21/823871 |

OTHER PUBLICATIONS

Mignot et al., "Single Damascene Copper interconnect for via formation using TiN HMO" Jun. 27, 2017.

* cited by examiner

(12) United States Patent
US 11,101,175 B2

TALL TRENCHES FOR VIA CHAMFERLESS AND SELF FORMING BARRIER

BACKGROUND OF THE INVENTION

The invention relates to semiconductor structures and, more particularly, to chamferless via structures and methods of manufacture.

Integrated circuits (ICs) typically include a plurality of semiconductor devices and interconnect wiring. Networks of metal interconnect wiring typically connect the semiconductor devices from a semiconductor portion of a semiconductor substrate. Multiple levels of metal interconnect wiring above the semiconductor portion of the semiconductor substrate are connected together to form a back-end-of-the line (BEOL) interconnect structure.

Several developments have contributed to increased performance of contemporary ICs. One such development is technology scaling which results in higher integration of structures, e.g., transistors, wiring, etc. However, technology scaling has posed several challenges including, e.g., process variation, stricter design rules, etc. For example, in trench first via last metal hard mask integration schemes, excessive non-self-aligned via (Non-SAV) chamfering can result during trench formation. This integration scheme results in chamfering which is very difficult to control, and can result in poor yields, jagged surfaces and shorting issues.

SUMMARY OF THE INVENTION

In one embodiment, a method for fabricating chamferless vias is disclosed. The method comprises receiving a substrate stack comprising a dielectric layer and a plurality of trenches formed therein. The plurality of trenches are filled with a conductive material to form a set of wiring vias with a first height (M1+V1). Next, a block mask is used over a capping material layer to expose a portion of the conductive material in contact with a subset of the set of wiring vias to etch to a second height (M1). The capping material layer and the conductive material are etched and a set of wiring vias are defined by the block mask, thereby forming a subset of wiring vias of the second height (M1) in response to the etching and a subset of wiring vias of the first height (M1+V1) underneath the block mask. The dielectric layer may be an ultra-low-k material. The conductive material a set of metallic element such as Copper, Aluminum, Tungsten, Hf, Ru, Ti, and Ta.

In another embodiment, a structure is disclosed. The structure comprises a conductive line and a set of chamferless wiring vias formed in a dielectric material with at least one of the set of chamferless wiring vias in contact with the conductive line. The set of chamferless wiring vias is formed with at least a first subset of wiring vias of a first height and a second subset of wiring vias of a second height. A barrier is formed over the second subset of wiring vias of the second height.

In a further embodiment, an integrated circuit is disclosed. The integrated circuit comprises one or more semiconductor structures. At least one of the one or more semiconductor structures comprises a conductive line and a set of chamferless wiring vias formed in a dielectric material with at least one of the set of chamferless wiring vias in contact with the conductive line. The set of chamferless wiring vias is formed with at least a first subset of wiring vias of a first height and a second subset of wiring vias of a second height. A barrier is formed over the second subset of wiring vias of the second height.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1A:
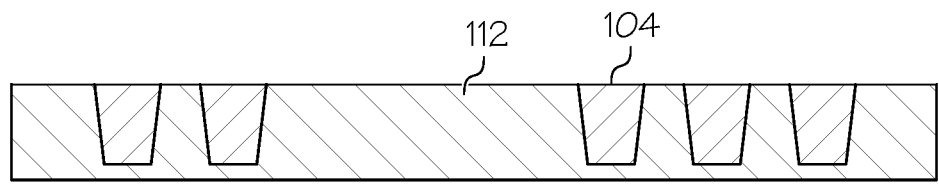
FIGS. 1A through 1C is a cross-sectional view of one example of prior art photolithographic patterning stack according to one embodiment of the present invention.

It is to be understood that the present disclosure will be described in terms of a given illustrative architecture; however, other architectures, structures, substrate materials, process features, and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip that may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The invention relates to semiconductor structures and, more particularly, to chamferless via structures and methods of manufacture during back end of the line (BEOL) processing. Advantageously, the processes described herein will result in final wiring structures.

The chamferless via structures of the present invention may be manufactured in a number of ways using a number of different tools. In general, though, the methodologies and tools are used to form structures with dimensions in the micrometer and nanometer scale. The methodologies, i.e., technologies, employed to manufacture the chamferless via structures of the present invention have been adopted from integrated circuit (IC) technology. For example, the structures of the present invention are built on wafers and are realized in films of material patterned by photolithographic processes on the top of a wafer. In particular, the fabrication of the chamferless via structures of the present invention uses three basic building blocks: (i) deposition of thin films of material on a substrate, (ii) applying a patterned mask on top of the films by photolithographic imaging, and (iii) etching the films selectively to the mask.

There are several overall aspects to the present invention. The first aspect is that there is a tall trench formation. The tall trench is the M1 height plus the V1 height. M1 is lower portion of a wiring via and the V2 an upper portion of the wiring via. A portion of the via defined by length V2 is sticking out after the M1 recess. The second aspect is the lithography for the via is a block mask using a save and cut approach. The portion of the via M2 is a trench type only. The third aspect is that the present invention does not require a self-aligned via (SAV) or full aligned via (FAV). The fourth aspect is that the via mask is a block and this may be easier to manufacture since it covers only the oxide area. The fifth aspect is that the present invention uses a self-formation barrier.

Figure 1B:
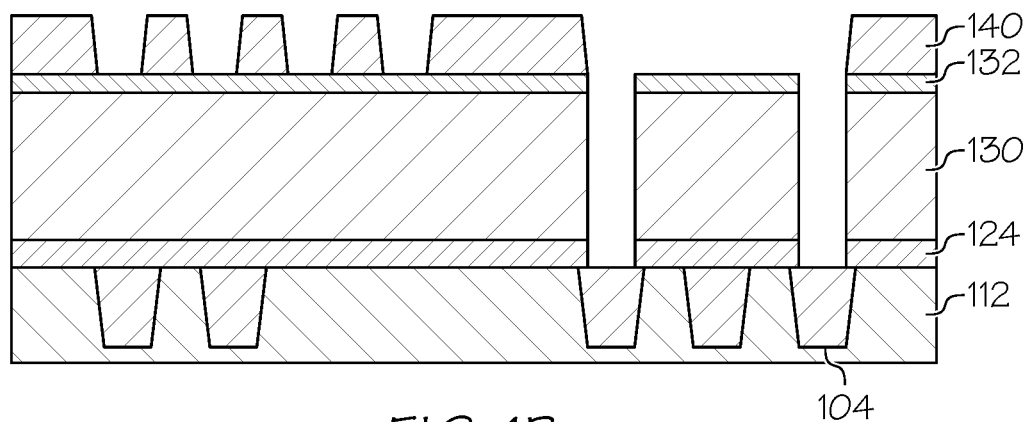
Figure 1C:
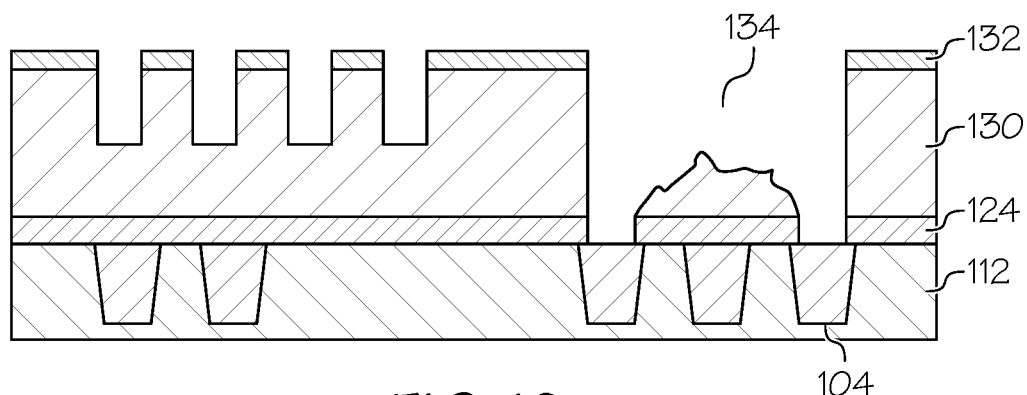

Now referring to the figures, shown in FIGS. 1A through 1C are cross-sectional views of one example of prior art photolithographic patterning stack according to one embodiment of the present invention. Starting with FIG. 1A shown is a M1 wiring via portion in substrate stack with conductive areas 104 comprising a dielectric layer 112. FIG. 1B is photolithographic patterning stack. A protective liner 124 is formed to cover the conductive areas 104 and dielectric layer 112 as shown. A ultra-low K material layer 130 is formed over a protective liner 124. A hard mask (HM) layer 132, such as TiN, and an Oxide mask 140 are formed on the ultra-low K dielectric 130. The process completes with metallization not drawn with a view of the degraded chamfer 134 as shown in FIG. 1C. Typically, the metallization forms a bridge between two conductive areas 104 with a chamfer.

Figure 2A:
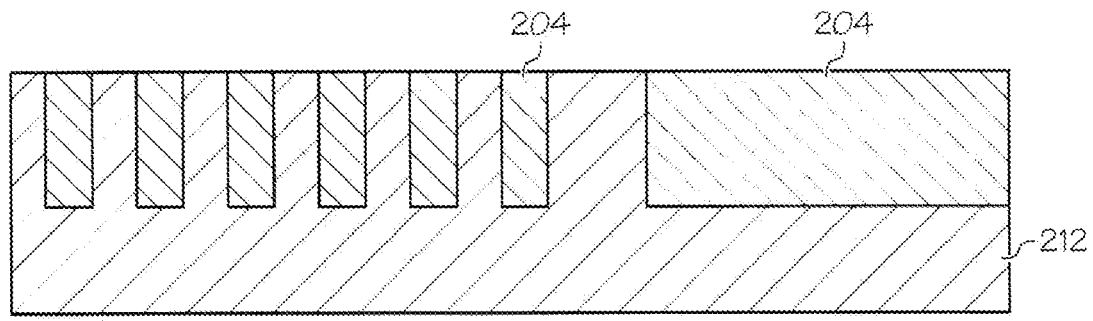
FIGS. 2A through 2C is a cross-sectional view of one example of the overall overview process for photolithographic patterning stack according to one embodiment of the present invention.
Figure 2B:
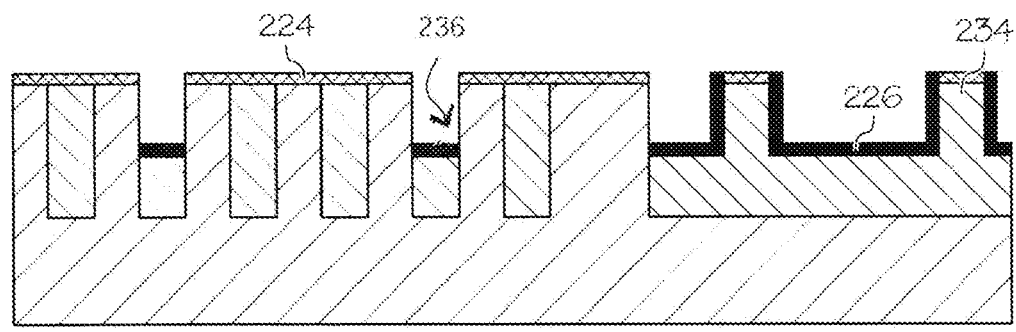
Figure 2C:
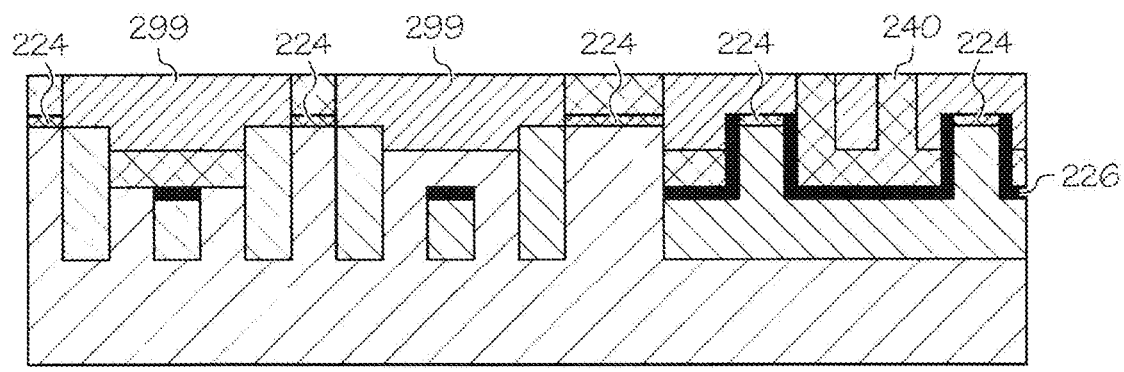

FIGS. 2A through 2C are cross-sectional views of one example of the overall overview process for photolithographic patterning stack according to one embodiment of the present invention. Shown is a M1 wiring via portion and V1 via portion 204 which is conductive in a dielectric layer 212. The overall via M130 V1 is two to three times smaller. In one example the overall via has a M1 trench portion of approximately 45 nm and the V1 portion of about 30 nm. Other dimensions for M1 and V1 are possible within the true scope of the present invention. FIG. 2B illustrates cutting the via so only the mostly the M1 portion 236 remains and some of the V1 portions 234 sticking out of the dielectric layer 212. Also shown is a cap layer 224 and self-barrier formation 226. FIG. 2C illustrates the structure after the metallization 299. Notice this structure is very different that the prior art structure in FIG. 1C. More specifically, in FIG. 1C the via is defined by the top metal while by opposite the via are defined by the bottom metal in FIG. 2. In contrast, unlike the prior art structure of FIG. 1C, the metallization in the present invention can be the same for bother the top metal and the bottom metal or defined as two different metal layers base on the device requirement.

Figure 3A:
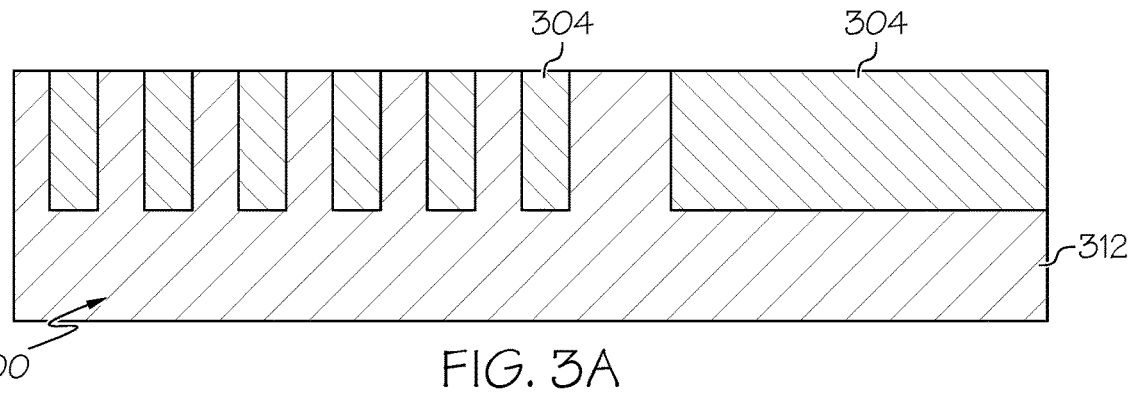
FIGS. 3A through 3C is a cross-sectional view of the first major process steps in the overall overview process for photolithographic patterning stack of FIG. 2.
Figure 3B:
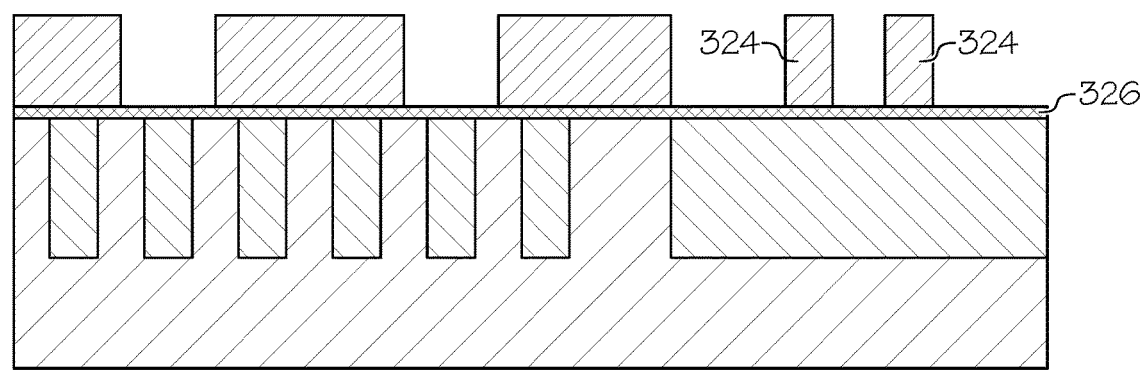
Figure 3C:
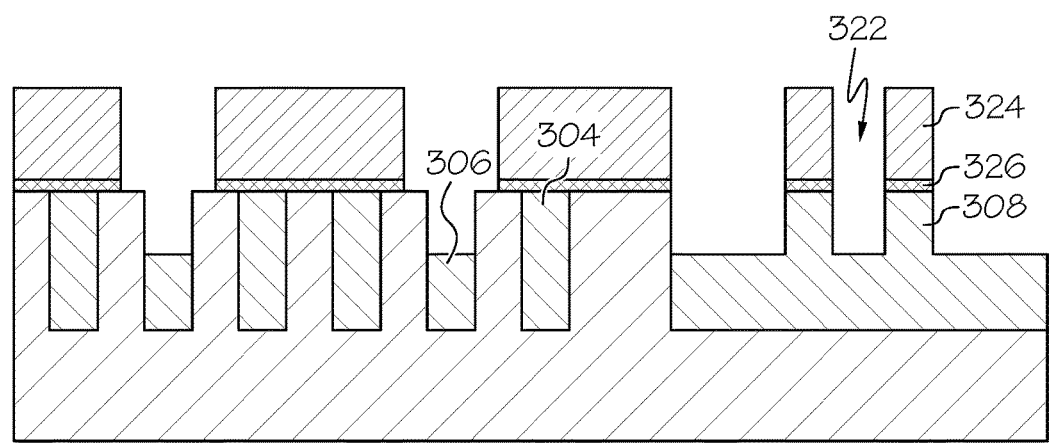

FIGS. 3A through 3C are cross-sectional views of the first major process steps in the overall overview process for photolithographic patterning stack of FIG. 2. The process starts with receiving a substrate stack comprising a dielectric layer 312 and a plurality of trenches formed therein. It is important to note that the substrate in some examples is a multilayer substrate with a structure that defines other functions of the overall integrated circuit or device. A substrate stack 312 may include a substrate with various layers formed thereon such as: (i) a porous, ultra-low-k (i.e., ultra-low dielectric constant) dielectric material ("ULK" or "ULK layer"); (ii) a hard mask layer comprising SiO2, SiCOH, and TiN, and/or another similarly suitable material overlying the ULK layer; and (iii) a conductive layer e.g., copper or tungsten, amongst other metal or metal alloys underlying the ULK layer. The ULK layer may be separated from the conductive layer by a cap (i.e., barrier) layer comprising another dielectric material, if it is not desired that the ULK layer come directly into contact with the conductive layer. Suitable materials for the cap layer may include, for example but without limitation, SiCN, SiN, SiC, SiCNH, and SiNO.

The dielectric layer 312 may be formed to a thickness of about 50 to 500 nm; although other dimensions are also contemplated by embodiments of the present invention. The dielectric layer 312 may be with low-K (UK) or ultra-low k (ULK) dielectric layer. The plurality of trenches are filled with a conductive material to form a set of wiring vias 304 with a first height (M1+V1).

FIG. 3B illustrates a cap layer 326 with a block mask 324 to define the cut area of the trench. In one example the cap layer is a Nblock cap layer 326. The Nblock cap layer 326 may be formed using conventional deposition processes, e.g., chemical vapor deposition (CVD), followed by lithographic process composed by a resist mask, anti-reflective coating such as Siarc and OPL layer 324 and etching, e.g., Reactive Ion Etching (RIE), wet etching or processes known to those of ordinary skill in the art such that further description is not required for an understanding of the invention. The lithography and etching process results in a self-aligned via structure as described herein.

In one or more embodiments, the openings e.g. 322 are formed by conventional lithography and etching processes. For example, a resist may be formed over the hard mask (not shown), which is exposed to energy (light) to form a pattern (openings). A reactive ion etching (RIE) process may then be performed through the openings of the resist to form the openings in the hard mask. The resist may then removed using conventional stripants or oxygen ashing processes.

The OPL block mask 324 saves the via 304 in opening 322 but removes everything else through an etching step. As shown in FIG. 3C portions of the wiring vias 304 are removed using appropriate chemistry. Shown are examples of subsets of wiring vias 304 with two distinct heights: a first height M1+V1 308 underneath the block mask 324, and a second height M1 306. One example of the dry etching process chemistry will be the use of BCl3/Cl2 for Aluminum or Titanium metal, SF6 or Cl2 for Tungsten metal, or any other gas chemistries known. Etch process stops at the M1 height.

Figure 4A:
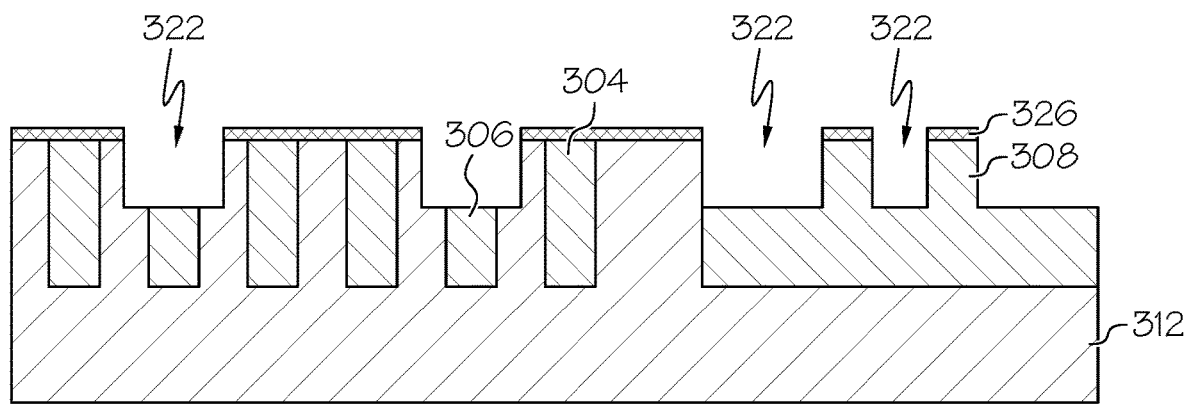
FIGS. 4A through 4B is a cross-sectional view of the second major process steps in the overall overview process for photolithographic patterning stack of FIG. 2.

FIG. 4A is a cross-sectional view of the second major process steps in the overall overview process for photolithographic patterning stack of FIG. 2. Block mask 324 is removed using a dry strip chemistry base on CO/CO2, or N2/H2 for example. In this way, the underlying cap layer 326, the wiring via 304, the wiring via of second height M1 306, the wiring via of the first height M1+V1 308 and part of 312 around the via opening 322 are exposed.

Figure 4B:
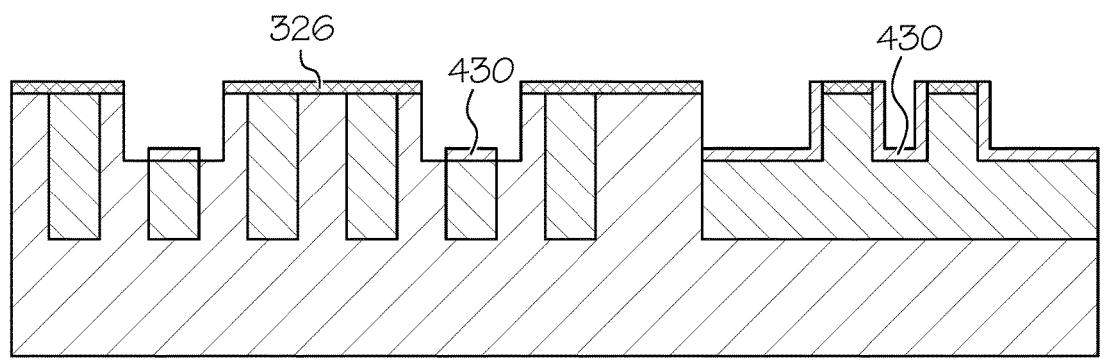

FIG. 4B illustrates the next process of selective metal deposition for creating a self-barrier 430 is performed. The self-barrier 430 is a selective liner deposition is created by exposing the substrate surface to a cobalt containing precursor gas in a multi ALD or CVD deposition and treatment cycles process for example. The cobalt capping material layer will selectively form over the metallic feature surface while leaving the dielectric surface free of deposition. This self-barrier 430, in one example, is Cobalt (Co), Titanium (Ti) or a combination. Other metals may be used. The self-barrier layer 430 is optional base on the metal used for layer 304 but required for some metal such as Copper. The selective deposition layer is used to prevent metal migration into the dielectric layer 312 and act as a barrier mostly in case of M1 Copper for metal wiring vias 304.

Figure 5:
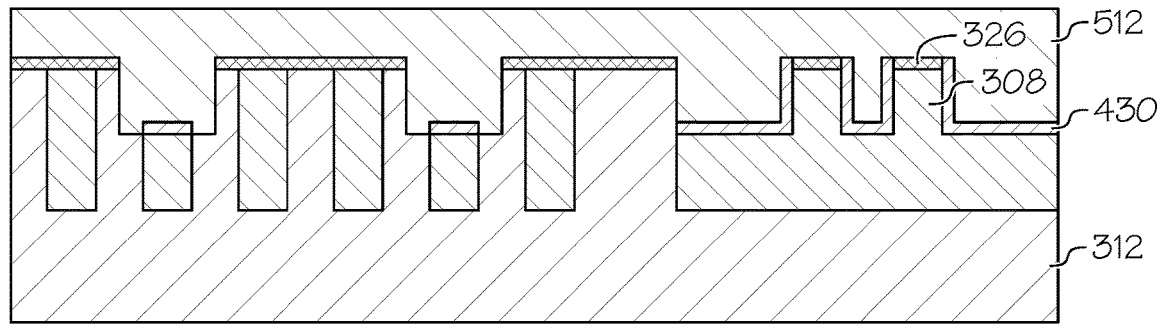
FIG. 5 is a cross-sectional view of the third major process steps in the overall overview process for photolithographic patterning stack of FIG. 2.

FIG. 5 shows a cross-sectional view of the third major process steps in the overall overview process for photolithographic patterning stack of FIG. 2. The third major process is dielectric layer 512 deposition. This dielectric layer 512 may be formed as a low-K (UK) or ultra-low k (ULK) dielectric layer. The dielectric 512 like the first Dielectric 312 may be deposited over the structure, e.g., cap 326 and self-barrier 430. In embodiments, the Dielectric layer 512 may be spun on and baked or may be deposited by CVD. The dielectric 512 may be baked at lower temperatures, such as 150-200° C. to avoid damaging any other materials. The formation of the dielectric layer or dielectric 512 is followed by chemical-mechanical planarization (CMP). The dielectric layer 512, in one example, is the same material as 312. In another example the material 512 may be different material from the material 312.

Figure 6:
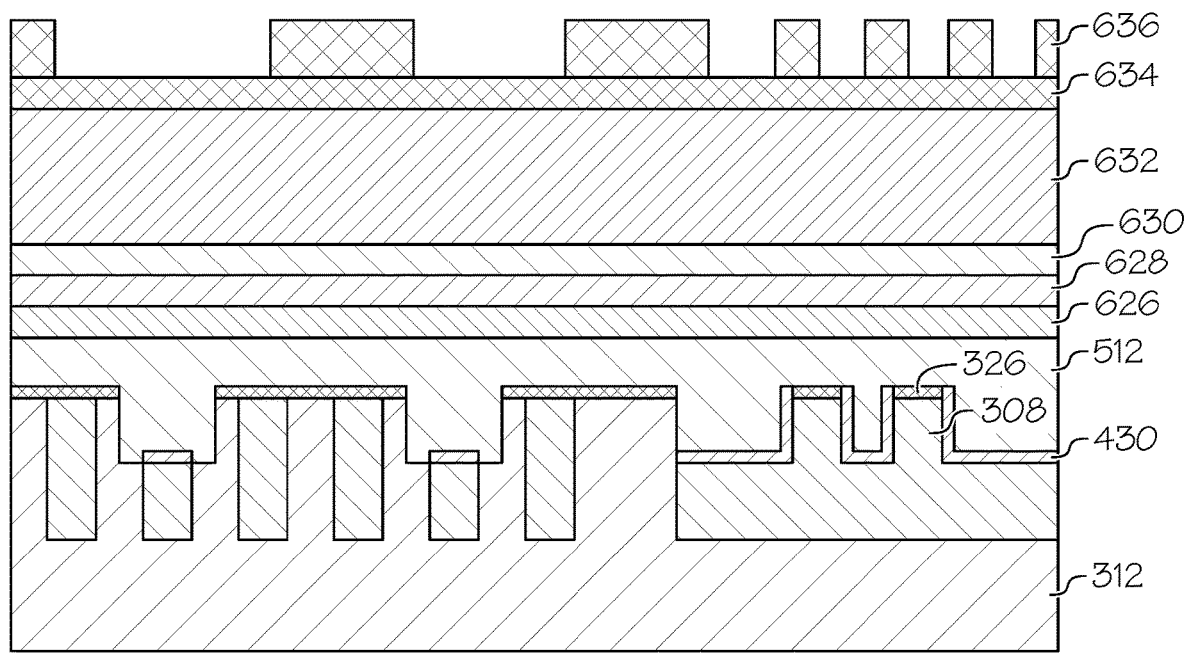
FIG. 6 is a cross-sectional view of the fourth major process steps in the overall overview process for photolithographic patterning stack of FIG. 2.

FIG. 6 is a cross-sectional view of the fourth major process steps in the overall overview process for photolithographic patterning stack of FIG. 2. This process comprises multi-layer stack deposition with previous hard mask oxide (HMO) lithography. Shown is a first sacrificial layer 626 formed over the dielectric layer 512. FIG. 6 also shows a Titanium Nitride (TiN) layer 628 formed over the first sacrificial layer 626. Next, an oxide derived from TEOS (tetraethylorthosilicate) layer 630, a silicon oxide, a silane oxide, or a Si-containing ARC material (SiARC) may be deposited on top of TiN layer 628. Another organic planarization layer (OPL) layer 632 may be deposited over the TEOS layer 630. Next, a Si-rich anti-reflective coating (SiARC) layer 634 may be disposed on top of OPL layer 632 followed by the resist layer 636 defining the area to etch.

Figure 7A:
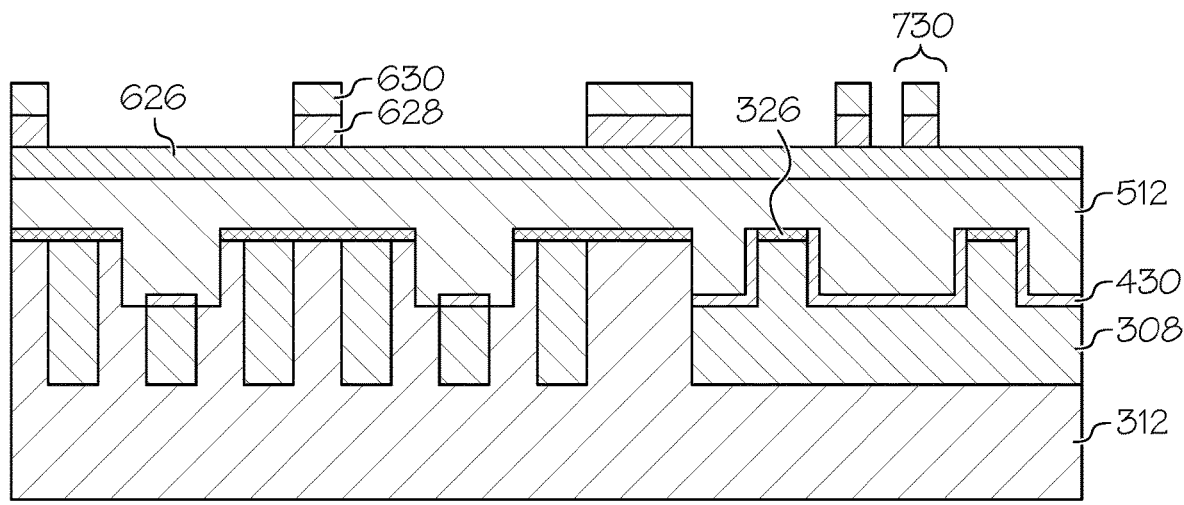
FIGS. 7A through 7B is a cross-sectional view of the fifth major process steps in the overall overview process for photolithographic patterning stack of FIG. 2.
Figure 7B:
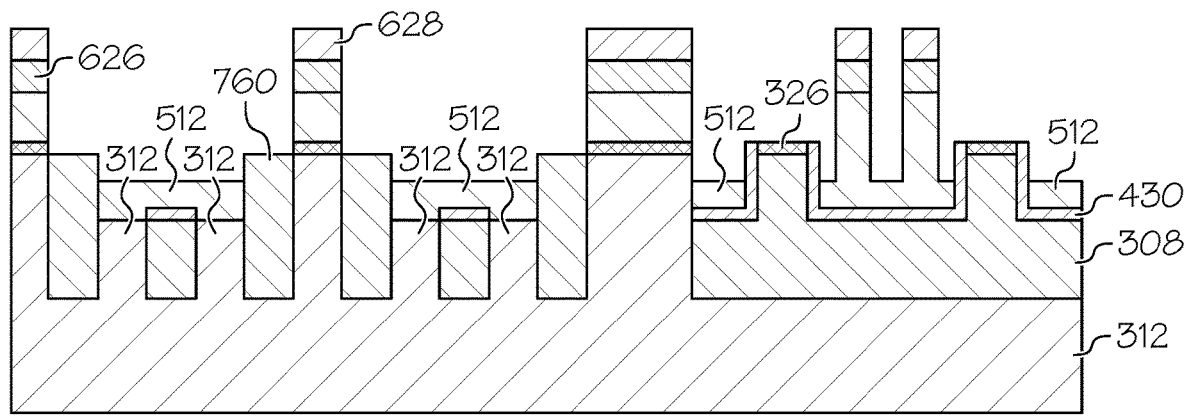

FIGS. 7A through 7B show a cross-sectional view of the fifth major process steps in the overall overview process for photolithographic patterning stack of FIG. 2. The resist layer 636 of FIG. 6 is used to form the pattern on TEOS 630 and TiN 628 forming stack 730 stopping on the first sacrificial layer 626. Resist layer 636, Siarc layer 634 and OPL layer 632 are etched away during that sequence. FIG. 7B illustrates etching the trench into dielectric 512 using RIE etch processes with stack 730 as mask. The process will etch the first sacrificial layer 626, top TEOS 636, part of the dielectric 512 to the desired height and the Cap layer 326. The trench dielectric 512 reveals some of the ULK trench with some over etch (OE) to reveal the top via 760.

Figure 8:
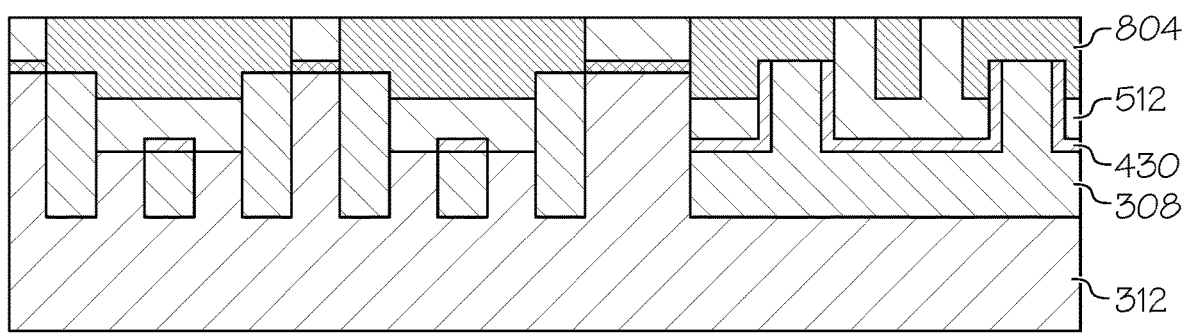
FIG. 8 is a cross-sectional view of the sixth major process steps in the overall overview process for photolithographic patterning stack of FIG. 2.

FIG. 8 is a cross-sectional view of the sixth major process steps in the overall overview process for photolithographic patterning stack of FIG. 2. In this step, metallization 804 is formed. The metallization may be the same material as metallization 304 or different material. A liner, which is not shown, may be situated below the metallization 804 all around previous structure. The metallization 804 may be a copper material formed by an electroplating process as is well known to those of skill in the art. In embodiments, prior to the metal fill process, any residual RIE material may be cleaned from the wiring via 304 and the trenches using a wet etch process, followed by deposition of a barrier and seed layer. Sacrificial layers 626 and TiN 628 used for patterning are removed by wet clean prior metallization 804 or after using a CMP process. The barrier layer may prevent metal diffusion into the ultra-low-k dielectric and it may promote seed layer adhesion. After the deposition of a barrier and seed layer, the electroplating process may commence to form metal lines, e.g., metal fill material 804. Any residual metal fill material 804 on a surface of the structure may be removed by a conventional planarization process. e.g., chemical mechanical polishing (CMP).

Figure 9:
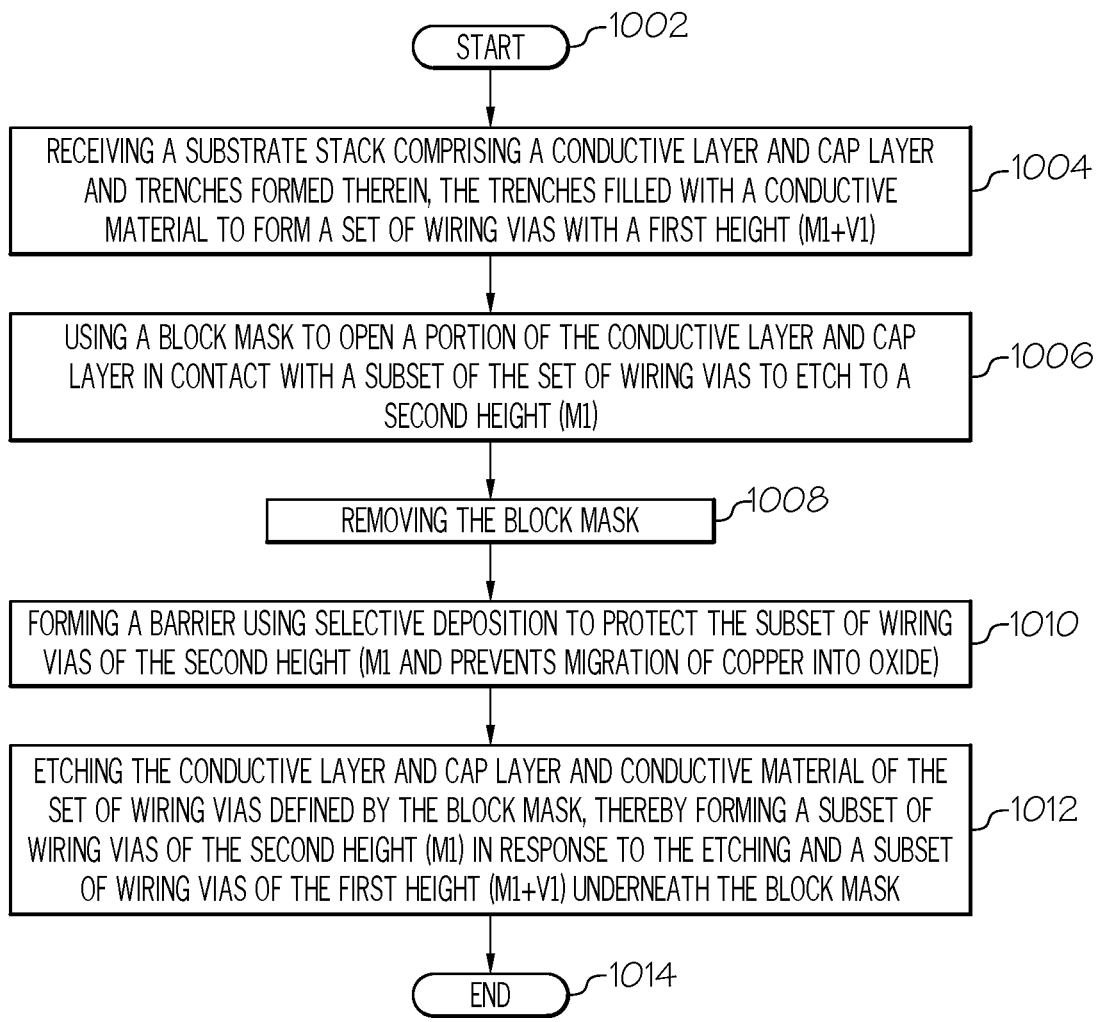
FIG. 9 is a flow chart depicting a method for forming chamferless vias in accordance with at least one embodiment of the present invention.

FIG. 9 is a flow chart illustrating one example of a method for forming chamferless vias in accordance with at least one embodiment of the present invention. As illustrated, the method starts at step 1002 and immediately proceeds to step 1004 in which a substrate stack is received e.g. 300 of FIG. 3. The substrate includes a dielectric layer and trenches formed therein. The trenches are filled with a conductive material to form a set of wiring vias 304 with a first height (M1+V1). A block mask, at step 1006, is used to expose a portion of the conductive material 304 and Nblock Cap layer 326 in contact with a subset of the set of wiring vias to etch to a second height (M1). The block mask, at step 1008, is removed. A selective barrier liner, at step 1010, is formed using selective deposition to protect the subset of wiring vias of the second height (M1) and to prevent migration of copper into oxide. In step 1012, the dielectric layer and the conductive material are etched. The etching forms a set of wiring vias defined by the block mask, thereby forming a subset of wiring vias of the second height (M1) in response to the etching and a subset of wiring vias of the first height (M1+V1). The process ends at step 1014.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A structure comprising:
a first conductive line at a first height;
a second conductive line at a second height, wherein the second height is less than the first height; and
a set of chamferless wiring vias formed in a dielectric material comprising an ultra-low-k material, the set of chamferless wiring vias are trenches filed with a conductive material, the set of chamferless wiring vias formed with at least a first subset of wiring vias of the first height with at least one of the first subset of wiring vias in contact with the first conductive line and a second subset of wiring vias of the second height with at least one of the second subset of wiring vias in contact with the second conductive line which is a barrier over the second subset of wiring vias of the second height,
wherein a bottom of the first subset of wiring vias and a bottom of the second subset of wiring vias are coplanar and at least a portion of the first conductive line is over at least a portion of the second conductive line, and
wherein a first portion of the first conductive line directly contacts a portion of the barrier that is in contact with a vertical sidewall of the conductive material in the at least one of the first subset of wiring vias, and a second portion of the first conductive line directly contacts a top-most surface of the conductive material in the at least one of the second subset of wiring vias.

2. The structure of claim 1, wherein the barrier is formed using cobalt, titanium, or a combination thereof.

3. The structure of claim 1, wherein the set of chamferless wiring vias is copper, aluminum, tungsten, cobalt, tantalum, hafnium, ruthenium, or any combination thereof.

4. The structure of claim 1, wherein the first conductive line is a top metal layer in contact with the at least one of the first subset of wiring vias.

5. The structure of claim 4, wherein the top metal layer is a different material than the set of chamferless wiring vias.

6. The structure of claim 4, wherein the top metal layer is an identical material to the set of chamferless wiring vias.

7. An integrated circuit comprising at least:
one or more semiconductor structures, wherein at least one of the one or more semiconductor structures comprises:
a substrate;
a dielectric material formed on the substrate;
a conductive line comprising a conductive material disposed entirely in the dielectric material, the conductive line comprising a bottom surface in contact with the dielectric material and a top surface disposed below a top-most surface of the dielectric material, wherein the conductive line comprises a first height;
a set of chamferless wiring vias formed entirely in the dielectric material, the set of chamferless wiring vias formed with at least a first subset of wiring vias and a second subset of wiring vias, the first subset of wiring vias comprising a layer of the conductive material having the first height and the second subset of wiring vias comprising a layer of the conductive material having a second height that is greater than the first height, wherein the layer of conductive material of at least one wiring via of the second subset of wiring vias is in direct contact with the conductive line; and
a barrier layer disposed in contact with a top-most surface of each wiring via of the first subset of wiring vias, wherein a top-most surface of each wiring via of the second subset of wiring vias is absent the barrier layer.

8. The integrated circuit of claim 7, wherein the barrier layer is formed using cobalt, titanium, or a combination thereof.

9. The integrated circuit of claim 7, wherein the set of chamferless wiring vias is copper, aluminum, tungsten, cobalt, tantalum, hafnium, ruthenium, or any combination thereof.

10. The integrated circuit of claim 7, wherein the top-most surface of each wiring via of the first subset of wiring vias and the second subset of wiring vias is the top-most surface of the layer of the conductive material.

11. The integrated circuit of claim 7, wherein the barrier layer comprises a portion that directly contacts a sidewall of at least one wiring via of the second subset of wiring vias.

12. The integrated circuit of claim 11, further comprising a top metal layer having a first portion that directly contacts the portion of the barrier layer in direct contact with the sidewall of the at least one wiring via, and a second portion that directly contacts the top-most surface of the at least one wiring via of the second subset of wiring vias.

13. A structure comprising:
a substrate;
a dielectric material formed on the substrate; and
a set of chamferless wiring vias formed entirely in the dielectric material, the set of chamferless wiring vias comprising a first subset of wiring vias having a height H1 and a second subset of wiring vias having a height H3 that is greater than the height H1, wherein each of the first subset of wiring vias is comprised entirely of a conductive metal via portion having the height H1, and wherein each of the second subset of wiring vias is comprised of a conductive metal via portion having the height H1 and a conductive via portion having a height H2, wherein the height H3 is equal to the height H1 plus the height H2, and wherein the conductive via portion is in direct contact with the conductive metal via portion.

14. The structure of claim 13, wherein a bottom-most surface of each conductive metal via portion directly contacts the dielectric material.

15. The structure of claim 13, further comprising:
a barrier layer disposed in contact with a top-most surface of each conductive metal via portion, wherein a top-most surface of each conductive via portion is absent the barrier layer.

16. The structure of claim 15, wherein a first portion of the barrier layer directly contacts the top-most surface of the conductive metal via portion of at least one wiring via of the second subset of wiring vias, and a second portion of the barrier layer directly contacts a sidewall of the conductive via portion of the at least one wiring via.

17. The structure of claim 16, further comprising a top metal layer having a first surface in direct contact with the top-most surface of the at least one wiring via, a second surface in direct contact with the second portion of the barrier layer, and a third surface in direct contact with a top surface of a dielectric layer situated adjacent to the conductive metal via portion of the at least one wiring via.

* * * * *